(12) United States Patent
Chen et al.

(10) Patent No.: US 6,873,057 B2
(45) Date of Patent: Mar. 29, 2005

(54) DAMASCENE INTERCONNECT WITH BI-LAYER CAPPING FILM

(75) Inventors: Jei-Ming Chen, Taipei Hsien (TW); Yi-Fang Chiang, Taipei Hsien (TW); Chih-Chien Liu, Taipei (TW)

(73) Assignee: United Microelectrtonics Corp., Hsin-Chu (TW)

( * ) Notice: Subject to any disclaimer, the term of this patent is extended or adjusted under 35 U.S.C. 154(b) by 0 days.

(21) Appl. No.: 10/248,750

(22) Filed: Feb. 14, 2003

(65) Prior Publication Data

US 2004/0161924 A1 Aug. 19, 2004

(51) Int. Cl.[7] .......................... H01L 23/48; H01L 23/52
(52) U.S. Cl. ....................... 257/777; 257/774
(58) Field of Search .................. 257/774; 438/629, 438/637, 639, 640, 667, 668

(56) References Cited

U.S. PATENT DOCUMENTS 6,147,009 A * 11/2000 Grill et al. .................. 438/780
6,566,242 B1 * 5/2003 Adams et al. ............... 438/622
6,649,531 B2 * 11/2003 Cote et al. ................... 438/714
6,656,840 B2 * 12/2003 Rajagopalan et al. ....... 438/687
6,737,747 B2 * 5/2004 Barth et al. ................. 257/760
2004/0173907 A1 * 9/2004 Chen et al. .................. 257/758

* cited by examiner

*Primary Examiner*—Matthew Smith
*Assistant Examiner*—Chuong Anh Luu
(74) *Attorney, Agent, or Firm*—Winston Hsu

(57) ABSTRACT

A damascene interconnect structure with a bi-layer capping film is provided. The damascene interconnect structure comprises a semiconductor layer and a dielectric layer disposed on the semiconductor layer. The dielectric layer has a main surface and at least one damascened recess provided on the main surface. A copper wire is embedded in the damascened recess. The copper wire has a chemical mechanical polished upper surface, which is substantially co-planar with the main surface of the dielectric layer. After polishing the upper surface of the copper wire, the upper surface is pre-treated and reduced in a conductive plasma environment at a temperature of below 300° C. A bi-layer capping film is thereafter disposed on the upper surface of the copper wire. The bi-layer capping film consists of a lower HDPCVD silicon nitride layer and an upper doped silicon carbide layer.

4 Claims, 4 Drawing Sheets

DAMASCENE INTERCONNECT WITH BI-LAYER CAPPING FILM

BACKGROUND OF INVENTION

1. Field of the Invention

The present invention relates generally to copper interconnects. More particularly, the present invention relates to a dual damascene structure capable of suppressing hillocks in copper interconnects.

2. Description of the Prior Art

Damascene processes incorporated with copper interconnect technique are known in the art, which are also referred to as "copper damascene processes". The copper damascene processes provide a solution to form a conductive wire coupled with an integral via plug without the need of etching copper. Either a single damascene or a dual damascene structure is used to connect devices and/or wires of an integrated circuit. Typically, at the end of a damascene process, a chemical mechanical polish (CMP) process is performed to planarize the surface of the semiconductor wafer so that the subsequent deposition and photolithographic processes will acquire an extended process window, and thus reliable multi-level interconnects can be formed.

FIG. 1 is a typical view of a semiconductor wafer 100 having aligned lower and upper damascened channels 102 and 104 with a connecting via 106. The lower and upper damascened channels 102 and 104 are respectively disposed in first and second channel dielectric layers 108 and 110. The via 106 is an integral part of the upper damascened channel 104 and is disposed in a via dielectric layer 112. A stop layer 122 is typically disposed between the via dielectric layer 112 and the second channel dielectric layer 110. The lower damascened channel 102 includes a barrier layer 126, which could optionally be a combined adhesion and barrier layer, and a seed layer 128 around a conductor core 130. The upper damascened channel 104 and the via 106 include a barrier layer 132, which could also optionally be a combined adhesion and barrier layer, and a seed layer 134 around a conductor core 136. The barrier layers 126 and 132 are used to prevent diffusion of copper into the adjacent areas of the semiconductor device.

In the single and dual damascene processes, after formation of the lower and upper damascened channels 102 and 104, respectively, the exposed conductor material 130 and 136 must be reduced and capped in-situ by the respective capping layers 120 and 124. With copper conductor materials, the capping layers 120 and 124 are formed by a process that first uses an ammonia or hydrogen plasma pre-treatment at 400° C. to reduce any residual copper oxide, which may be present on the exposed surfaces of the lower and upper damascened channels 102 and 104. This is followed by a silicon nitride deposition plasma enhanced chemical vapor deposition (PECVD) at 400° C. to provide the capping layers 120 and 124, which may be up to 500 angstroms in thickness.

However, the above-described prior art suffers from the formation of hillocks 140, or copper leakage lines, during the formation of capping layers 120 and 124 over exposed copper conductor materials. The hillocks 140, which can extend into both the capping layer and the dielectric layer, are capable of causing short circuits either immediately or over time. It has been found that the 400° C. ammonia plasma treatment causes the formation of small stress fractures in the lower and upper damascened channel dielectric layers 108 and 110, which allow the diffusion of copper to form hillocks 140. It has also been found that the PECVD deposition at 400° C. also develops stress fractures in the capping layers 120 and 124, which create hillocks 140, which extend through the capping layers 120 and 124.

SUMMARY OF INVENTION

Accordingly, the main purpose of the present invention is to provide an improved damascene interconnect structure with a bi-layer capping film for suppressing the formation of hillocks.

In accordance with the claimed invention, a damascene interconnect structure with a bi-layer capping film is provided. The damascene interconnect structure comprises a semiconductor layer and a dielectric layer disposed on the semiconductor layer. The dielectric layer has a main surface and at least one damascened recess provided on the main surface. A copper wire is embedded in the damascened recess. The copper wire has a chemical mechanical polished upper surface, which is substantially co-planar with the main surface of the dielectric layer. After polishing the upper surface of the copper wire, the upper surface is pre-treated and reduced in a conductive plasma environment. A bi-layer capping film is thereafter disposed on the upper surface of the copper wire. The bi-layer capping film consists of a lower HDPCVD silicon nitride layer and an upper doped silicon carbide layer.

The present invention takes advantages of the HDPCVD deposition to reduce thermal budget, thereby suppressing the formation of hillocks. Further, the present invention utilizes a bi-layer capping film based on a novel silicon nitride/silicon carbide system, thereby enhancing the resistance to stress fractures and ability to prevent copper diffusion. Moreover, the use of the upper doped SiC layer of the bi-layer capping film has a relatively low dielectric constant (k=4.4) compared to the silicon nitride layer (k=7.0), thus reduce the RC delay of integrated circuit.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
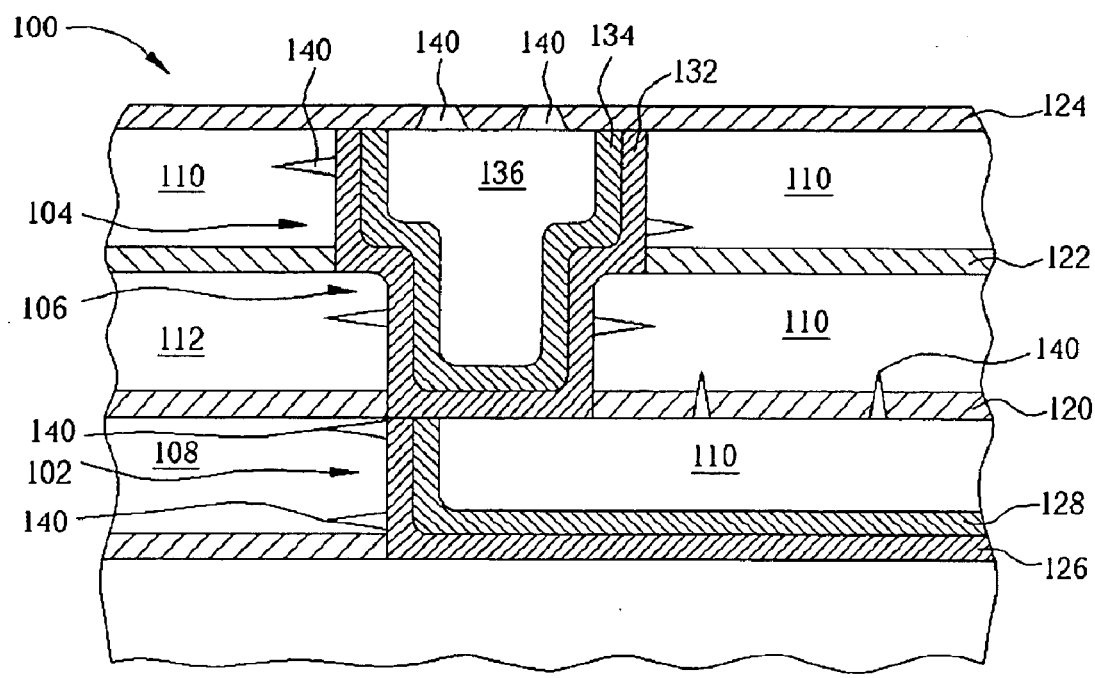
FIG. 1 is a cross section of aligned lower and upper damascened channels with a connecting via according to the prior art.
Figure 2:
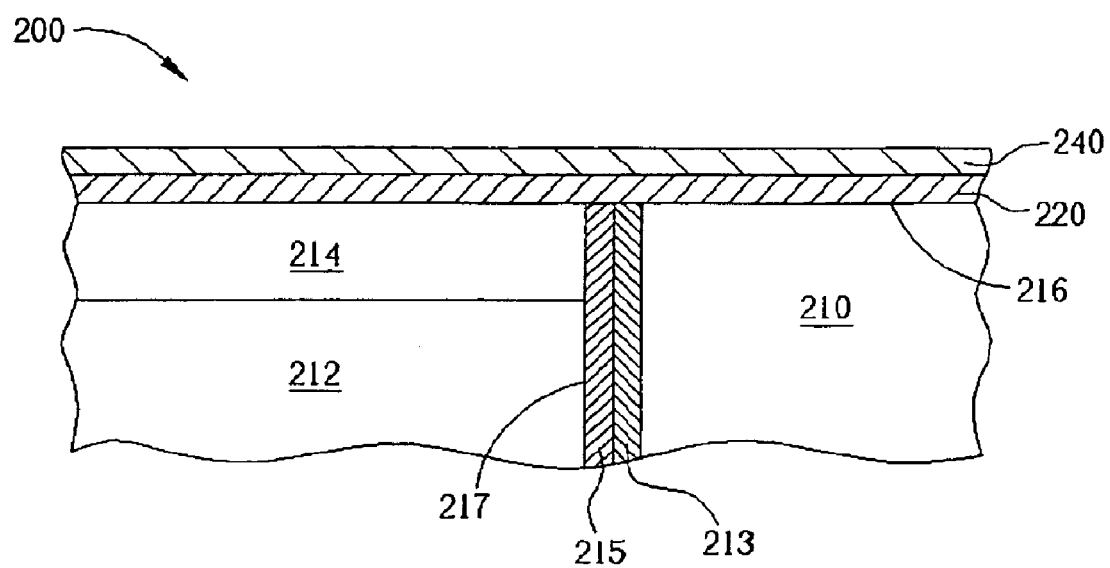
FIG. 2 is an enlarged cross-sectional view showing a portion of a damascene structure of a wafer according to one preferred embodiment of this invention.

Please refer to FIG. 2. FIG. 2 is an enlarged cross-sectional view showing a portion of a damascene structure of a wafer 200 according to one preferred embodiment of this invention. As shown in FIG. 2, the wafer 200 comprises an inter-layer dielectric 212, in which a damascened recess 217 is provided. On the sidewalls and the bottom (not shown) of the damascened recess 217, a barrier layer 215, a seed layer 213 and a copper layer 210 are sequentially deposited to fill the damascened trench 217. The inter-layer dielectric 212 may be made of low-dielectric constant materials such as FLARE™, SiLK™, poly(arylene ether) polymer, parylene, polyimide, fluorinated polyimide, HSQ, BCB, FSG, silicon dioxide, nanoporous silica, etc. The barrier layer 215 may be made of materials such as tantalum (Ta), titanium (Ti), tungsten (W), nitrides thereof, and combinations thereof. The copper layer 210 has a chemical mechanical polished upper surface 216, which is co-planar with adjacent polishing stop layer 214. The polishing stop layer 214 is typically made of silicon nitride or silicon oxy-nitride. After polishing the copper layer 210, to reduce any residual copper oxide, the upper surface 216 of the copper layer 210 is pre-treated with reductive substances such as hydrogen plasma, ammonia plasma, or the like at a process temperature of below 400° C., and followed by in-situ deposition of a bi-layer capping film or bi-layer protection film, which consists of an upper doped silicon carbide layer 240 and a lower HDPCVD silicon nitride layer 220. It is noted that the damascened recess 217 may be a damascene trench for accommodating a conductor wire or a via opening for accommodating a via plug.

Figure 3:
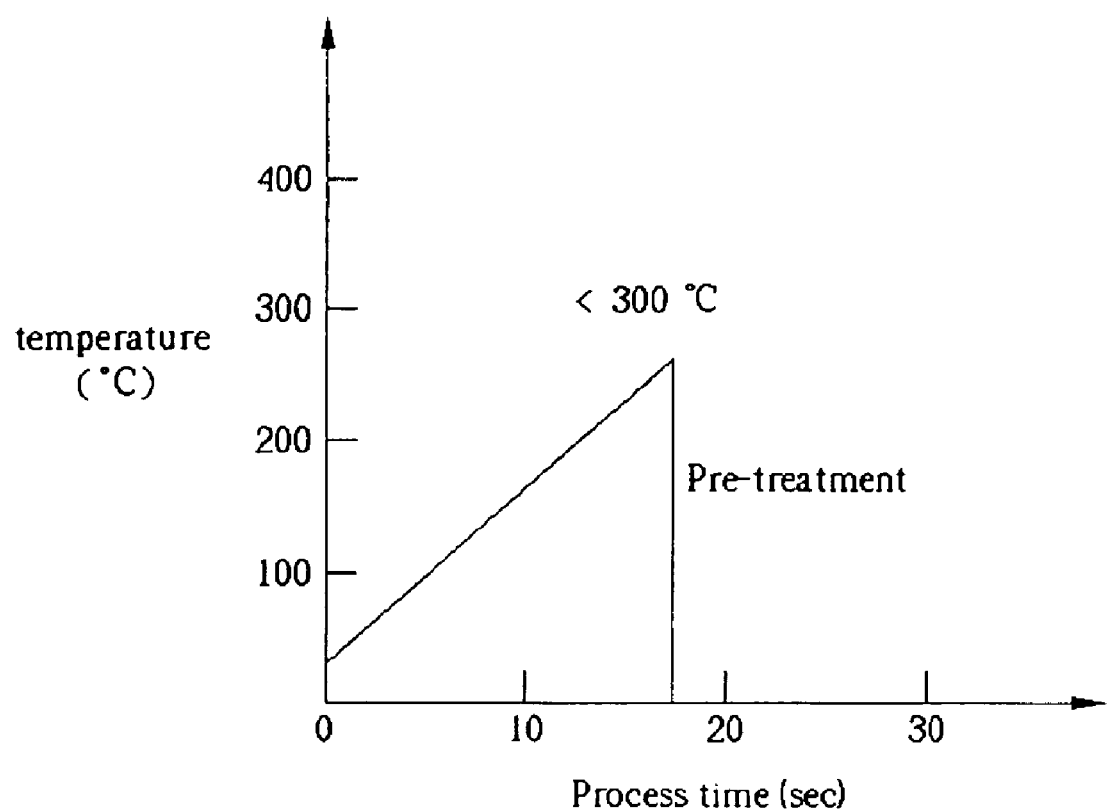
FIG. 3 illustrates the thermal budget during the reduction pre-treatment according to the present invention.

The present invention features its bi-layer capping film, which consists of the lower HDPCVD silicon nitride layer 220 and the upper doped silicon carbide layer 240, deposited over the reduced copper surface 216 for suppressing the formation of hillocks, which are capable of causing short circuits either immediately or over time. Referring to FIG. 3, the reduction pre-treatment is performed within a HDPCVD vacuum chamber preferably at a temperature of below 300° C. and a source power of above 3000 watts for a time period of about 10 to 60 seconds to minimize the residual oxidant on the upper surface 216 of the copper layer 210. The HDP deposition is performed at a temperature between 300° C. and 400° C., preferably below 350° C., with the source power higher than 2250 watts and a bias power of about 1800 watts. As shown in FIG. 3, in accordance with the preferred embodiment of the present invention, since the process temperature within the HDPCVD vacuum chamber during the reduction pre-treatment process can be elevated from room temperature to a temperature of below 300° C., for example, 280° C., the thermal budget of the pre-treatment is reduced. As a result, such in-situ plasma pre-treatment and HDP SiN deposition method is capable of suppressing hillock formation. Preferably, the thickness of the HDPCVD silicon nitride layer 220 is between 300 angstroms and 700 angstroms, more preferably 500 angstroms.

It has been discovered that the introduction of the doped silicon carbide layer 240 into the bi-layer capping film applications can unexpectedly improve the resistance to the stress fractures during film deposition. The doped silicon carbide (SiC) layer 240 may be made of oxygen doped SiC (SiCOH) or nitrogen doped SiC (SiCNH), preferably SiCOH. The doped SiC layer 240 may be formed by chemical vapor deposition using 3-methyl silane or 4-methyl silane as a precursor below 400° C. The use of methyl-containing silanes to produce silicon dioxide, amorphous SiCN and SiC films by chemical vapor deposition is known in the art. For example, U.S. Pat. No. 5,465,680 to Loboda discloses a method for making crystalline SiC films. Compared to the underlying HDPCVD silicon nitride layer 220, the doped SiC layer 240 has a lower dielectric constant of about 4.4 (the dielectric constant of the silicon nitride layer is about 7.0), such that the RC delay of the integrated circuit can be reduced. Further, the doped SiC layer 240 is an excellent candidate for being a copper barrier, which can effectively prevent the copper atoms from diffusing to adjacent dielectrics.

Figure 4:
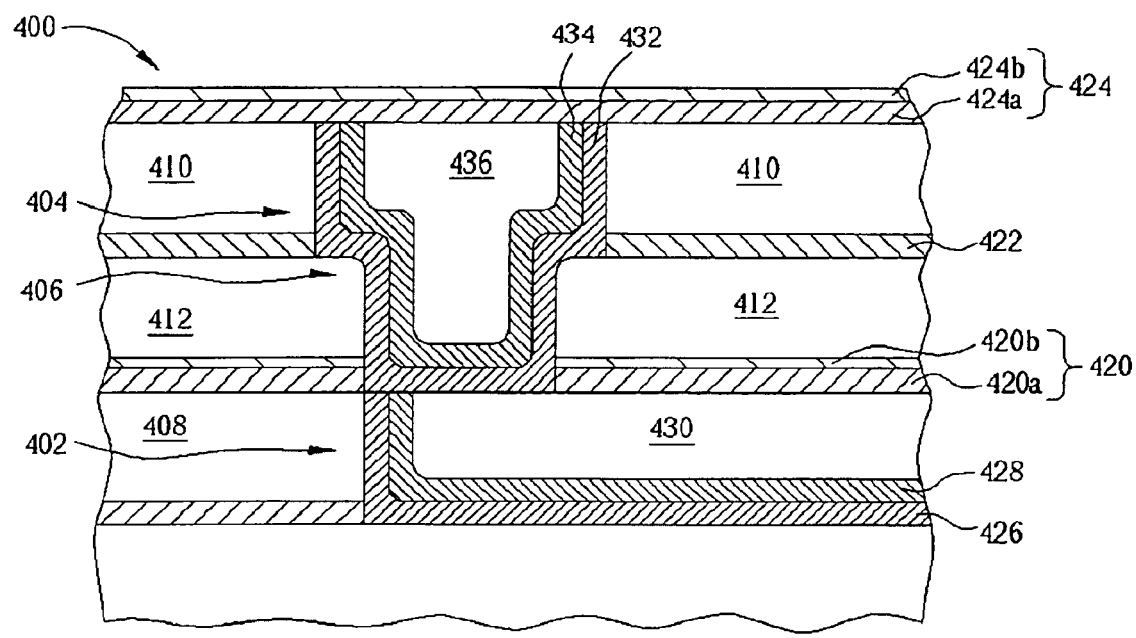
FIG. 4 is a cross section of aligned lower and upper damascened channels with a connecting via showing the bi-layer capping film.

Please refer to FIG. 4. FIG. 4 is a cross section of aligned lower and upper damascened channels 402 and 404 with a connecting via 406 showing the bilayer capping films 420 and 424 according to this invention. As shown in .FIG. 4, likewise, a semiconductor wafer 400 comprises a lower and upper damascened channels 402 and 404 respectively disposed in first and second channel dielectric layers 408 and 410. The via 406 is an integral part of the upper damascened channel 404 and is disposed in a via dielectric layer 412. A stop layer 422 is disposed between the via dielectric layer 412 and the second channel dielectric layer 410. The lower damascened channel 402 includes a barrier layer 426, which could optionally be a combined adhesion and barrier layer, and a seed layer 428 around a conductor core 430. The upper damascened channel 404 and the via 406 include a barrier layer 432, which could also optionally be a combined adhesion and barrier layer, and a seed layer 434 around a conductor core 436. The barrier layers 426 and 432 are used to prevent diffusion of copper into the adjacent areas of the semiconductor device.

As mentioned, after the formation of respective lower and upper damascened channels 402 and 404, which have been polished by chemical mechanical polish process, reduction pre-treatments are first performed in a HDPCVD chamber to reduce residual copper oxides on the exposed surfaces of the conductor cores 430 and 436, followed by in-situ deposition of HDPCVD silicon nitride layers 420a and 424a and deposition of doped silicon carbide layers 420b and 424b. The bi-layer capping films 420 and 424 can prevent the conductor cores 430 and 436 from further oxidation and diffusion to adjacent dielectrics. The bi-layer capping film 420 consists of the HDPCVD silicon nitride layer 420a and the doped SiC layer 420b. The bi-layer capping film 4204 consists of the HDPCVD silicon nitride layer 424a and the doped SiC layer 424b. The reduction pre-treatment is carried out in a HDPCVD chamber at a temperature of less than 300° C. using hydrogen plasma, $N_2H_2$ plasma, ammonia plasma, or the like. This is followed by an in-situ silicon nitride deposition using high density plasma chemical vapor deposition (HDPCVD) at a temperature of below 350° C., and a doped silicon carbide deposition.

In contrast to the prior art, the present invention takes advantages of the HDPCVD deposition to reduce thermal budget, thereby suppressing the formation of hillocks. Further, the present invention utilizes a bi-layer capping film based on a novel silicon nitride/silicon carbide system to improve the resistance to stress fractures and ability to prevent copper diffusion. Moreover, the use of the upper doped SiC layer of the bi-layer capping film has a relatively low dielectric constant compared to the silicon nitride layer, thus reduce the RC delay of integrated circuit.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A damascene interconnect structure with a bi-layer capping film, comprising:

a semiconductor layer;

a dielectric layer disposed on the semiconductor layer, the dielectric layer having a main surface and at least one damascened recess provided on the main surface;

a conductive wire embedded in the damascened recess, the conductive wire having a chemical mechanical polished upper surface which is substantially co-planar with the main surface of the dielectric layer; and a bi-layer capping film consisting of a lower HDPCVD silicon nitride layer and an upper oxygen-doped silicon carbide (SiCOH) layer, the bi-layer capping film capping the polished upper surface of the conductive wire and the main surface of the dielectric layer.

2. The damascene interconnect structure with a bi-layer capping film according to claim 1 wherein the conductive wire is a copper wire, and after polishing the upper surface of the copper wire, the upper surface is pre-treated and reduced in a conductive plasma environment.

3. The damascene interconnect structure with a bi-layer capping film according to claim 2 wherein the upper surface of the copper wire is pre-treated by using hydrogen or ammonia plasma at a temperature of below 300° C. for a time period of about 10 seconds to 60 seconds.

4. The damascene interconnect structure with a bi-layer capping film according to claim 1 wherein the lower HDPCVD silicon nitride layer is formed by high density plasma chemical vapor deposition (HDPCVD) at a temperature of below 350° C.

* * * * *